United States Patent [19]

Yamauchi et al.

[11] Patent Number: 5,640,067
[45] Date of Patent: Jun. 17, 1997

[54] THIN FILM TRANSISTOR, ORGANIC ELECTROLUMINESCENCE DISPLAY DEVICE AND MANUFACTURING METHOD OF THE SAME

[75] Inventors: Yukio Yamauchi, Kanagawa; Michio Arai, Tokyo, both of Japan

[73] Assignees: TDK Corporation, Tokyo; Semiconductor Energy Laboratory Co., Ltd., Kanagawa, both of Japan

[21] Appl. No.: 617,121

[22] Filed: Mar. 18, 1996

[30] Foreign Application Priority Data

Mar. 24, 1995 [JP] Japan ................... 7-065943

[51] Int. Cl.$^6$ ................. H01J 1/62; H01J 63/04; G09G 3/10
[52] U.S. Cl. ................. 313/504; 313/506; 313/509; 315/169.3; 315/169.1
[58] Field of Search ................. 313/504–509, 313/511, 512; 315/169.1, 169.3; 428/917; 257/501, 506, 508

[56] References Cited

U.S. PATENT DOCUMENTS 4,266,223  5/1981  Frame .................. 313/505 X
5,384,517  1/1995  Uno .................... 313/504 X Primary Examiner—Richard Chilcot
Assistant Examiner—Mack Haynes

[57] ABSTRACT

An organic EL display device has a substrate, a plurality of organic EL elements formed on the substrate and a plurality of thin film transistors formed on the substrate. The transistors are connected to the respective EL elements for controlling current applied to the respective elements. Each of the transistors includes an active layer of semiconductor material, formed on the substrate, a source region and a drain region being formed in the active layer, a source electrode of aluminum material electrically coupled to the source region formed in the active layer, a drain electrode of aluminum material electrically coupled to the drain region formed in the active layer, an insulation layer formed on the active layer, a gate electrode formed on the insulation layer, a first barrier metal layer of titanium nitride containing equal to or less than 50 atm % of nitrogen or titanium, inserted between the source electrode and the source region of the active layer, and a second barrier metal layer of titanium nitride containing equal to or less than 50 atm % of nitrogen or titanium, inserted between the drain electrode and the drain region of the active layer.

14 Claims, 3 Drawing Sheets

THIN FILM TRANSISTOR, ORGANIC ELECTROLUMINESCENCE DISPLAY DEVICE AND MANUFACTURING METHOD OF THE SAME

FIELD OF THE INVENTION

The present invention relates to a thin film transistor used in an organic electroluminescence (EL) display device, the organic EL display device and a method of manufacturing the organic EL display device.

DESCRIPTION OF THE RELATED ART

In an organic EL display device, many of organic EL elements are arranged in matrix on a substrate. Each of the EL elements, namely a pixel (picture element), consists of a transparent electrode layer, an organic EL layer and an upper electrode layer. At least one thin film transistor for controlling current applied to the EL element is electrically connected to this EL element.

In general, each of the thin film transistors has a silicon active layer with a source region and a drain region, and source and drain electrodes of aluminum material to be electrically connected to the source and drain regions, respectively. In the conventional thin film transistor, barrier metal layers made of chrome material are inserted between the silicon active layer and the source and drain electrodes so as to prevent silicon atoms in the silicon active layer from being diffused and disappeared into the source and drain electrodes of aluminum material.

However, according to the conventional organic EL display device, chrome used for material of the barrier metal layers of the thin film transistors often elutes into the upper electrode layers and the transparent electrode layers of the EL elements causing the thin film transistors to short-circuit with the upper electrode layers or the transparent electrode layers. Subsequently to this, all the chrome of the barrier metal layers may elute so that hollow spaces will be formed between the source and drain regions of the silicon active layers and the aluminum source and drain electrodes. This results disconnection of the source and drain regions and the respective electrodes. These short-circuit and disconnection will stop operations of the thin film transistors causing reliability of the organic EL display device to extremely lower.

SUMMARY OF THE INVENTION

It is therefore an object of the present invention to provide a thin film transistor used in an organic EL display device, the organic EL display device and a method of manufacturing the organic EL display device, whereby short-circuit and disconnection in the organic EL display device due to elusion of the barrier metal material of the thin film transistors can be prevented from occurring to keep high reliability of the organic EL display device.

According to careful study by the inventors of this application, it has come out that the aforementioned short-circuit and disconnection are caused by movement of ionized chrome to the organic EL elements. The ionization of the chrome and the movement of the ionized chrome will be occurred due to moisture provided from the organic EL layer made of high hydroscopic material and due to relatively high DC current (bias current) continuously flowing through the current control thin film transistors connected to the EL elements and through switching thin film transistors connected to and for driving the respective current control transistors.

Thus, according to the present invention, a thin film transistor which is formed in an organic EL display device having a substrate and a plurality of organic EL elements formed on the substrate is provided. This transistor used to drive one of the EL elements includes an active layer of semiconductor material, formed on the substrate, a source region and a drain region being formed in the active layer, a source electrode of aluminum material electrically coupled to the source region formed in the active layer, a drain electrode of aluminum material electrically coupled to the drain region formed in the active layer, an insulation layer formed on the active layer, a gate electrode formed on the insulation layer, a first barrier metal layer of titanium nitride containing equal to or less than 50 atm % of nitrogen or made of titanium, inserted between the source electrode and the source region of the active layer, and a second barrier metal layer of titanium nitride containing equal to or less than 50 atm % of nitrogen or made of titanium, inserted between the drain electrode and the drain region of the active layer.

According to the present invention, also, an organic EL display device having a substrate, a plurality of organic EL elements formed on the substrate and a plurality of thin film transistors formed on the substrate is provided. The transistors are connected to the respective EL elements for controlling current applied to the respective elements. Each of the transistors includes an active layer of semiconductor material, formed on the substrate, a source region and a drain region being formed in the active layer, a source electrode of aluminum material electrically coupled to the source region formed in the active layer, a drain electrode of aluminum material electrically coupled to the drain region formed in the active layer, an insulation layer formed on the active layer, a gate electrode formed on the insulation layer, a first barrier metal layer of titanium nitride containing equal to or less than 50 atm % of nitrogen or made of titanium, inserted between the source electrode and the source region of the active layer, and a second barrier metal layer of titanium nitride containing equal to or less than 50 atm % of nitrogen or made of titanium, inserted between the drain electrode and the drain region of the active layer.

Since the barrier metal layers in the current control thin film transistors arranged nearest to the respective organic EL elements are made of titanium nitride containing equal to or less than 50 atm % of nitrogen or made of titanium, no elusion of the barrier metal layers occurs resulting no short-circuit nor disconnection in the organic EL display device to keep high reliability of the organic EL display device.

It is preferred that each of the organic EL elements includes a transparent electrode layer formed on the substrate, an organic EL layer formed on the transparent electrode layer and an upper electrode layer formed on the organic EL layer, the transparent electrode being electrically coupled to a conductive lead of aluminum material, and that each of the organic EL elements further includes a contact metal layer of titanium nitride containing equal to or less than 50 atm % of nitrogen or made of titanium, inserted between the transparent electrode layer and the conductive lead. The above-mentioned conductive lead may be connected to the drain electrode.

Since both the barrier metal layers in the current control thin film transistors and the contact metal layer in the organic EL elements are simultaneously manufactured in the same process, manufacturing cost can be decreased. Of course, the contact metal layers made of titanium nitride containing equal to or less than 50 atm % of nitrogen or made of titanium will result tight and stable contact between the respective conductive leads of aluminum and the respective transparent electrode layers.

According to the present invention, furthermore, an organic EL display device of active matrix type having a substrate, a plurality of organic EL elements formed on the substrate and a plurality of first and second thin film transistors formed on the substrate is provided. The first transistors are connected to the respective EL elements for controlling current applied to the respective elements, and the second transistors are connected to the respective first transistors for switching the respective first transistors. Each of the first and second transistors includes an active layer of semiconductor material, formed on the substrate, a source region and a drain region being formed in the active layer, a source electrode of aluminum material electrically coupled to the source region formed in the active layer, a drain electrode of aluminum material electrically coupled to the drain region formed in the active layer, an insulation layer formed on the active layer, a gate electrode formed on the insulation layer, a first barrier metal layer of titanium nitride containing equal to or less than 50 atm % of nitrogen or made of titanium, inserted between the source electrode and the source region of the active layer, and a second barrier metal layer of titanium nitride containing equal to or less than 50 atm % of nitrogen or made of titanium, inserted between the drain electrode and the drain region of the active layer.

It is preferred that each of the organic EL elements includes a transparent electrode layer formed on the substrate, an organic EL layer formed on the transparent electrode layer and an upper electrode layer formed on the organic EL layer, the transparent electrode being electrically coupled to a conductive lead of aluminum material, and that each of the organic EL elements further includes a contact metal layer of titanium nitride containing equal to or less than 50 atm % of nitrogen or made of titanium, inserted between the transparent electrode layer and the conductive lead. The above-mentioned conductive lead may be connected to the drain electrode.

According to the present invention, also, a method for manufacturing an organic EL display device having a plurality of organic EL elements and a plurality of thin film transistors formed on a substrate is provided. Each of the organic EL elements and the thin film transistors is manufactured by the steps of depositing an active layer of semiconductor material on the substrate, forming a source region and a drain region in the active layer, forming a gate insulation layer on the active layer, forming a gate electrode on the gate insulation layer, depositing an insulation interlayer on the active layer and the substrate, removing a part of the insulation interlayer to form contact holes on the source and drain regions of the active layer and organic EL element forming region, forming a transparent electrode layer in the organic EL element forming region on the substrate, simultaneously forming first and second barrier metal layers and a contact metal layer of titanium nitride containing equal to or less than 50 atm % of nitrogen or made of titanium, the first and second barrier metal layers being formed in the contact holes on the source and drain regions of the active layer, the contact metal layer being formed on the transparent electrode layer, forming source and drain electrode and a conductive lead of aluminum material on the first and second barrier metal layers and the contact metal layer, respectively, forming an organic EL layer on the transparent electrode layer, and forming an upper electrode layer on the EL layer.

Further objects and advantages of the present invention will be apparent from the following description of the preferred embodiments of the invention as illustrated in the accompanying drawings.

DESCRIPTION OF THE PREFERRED EMBODIMENTS

Figure 1:
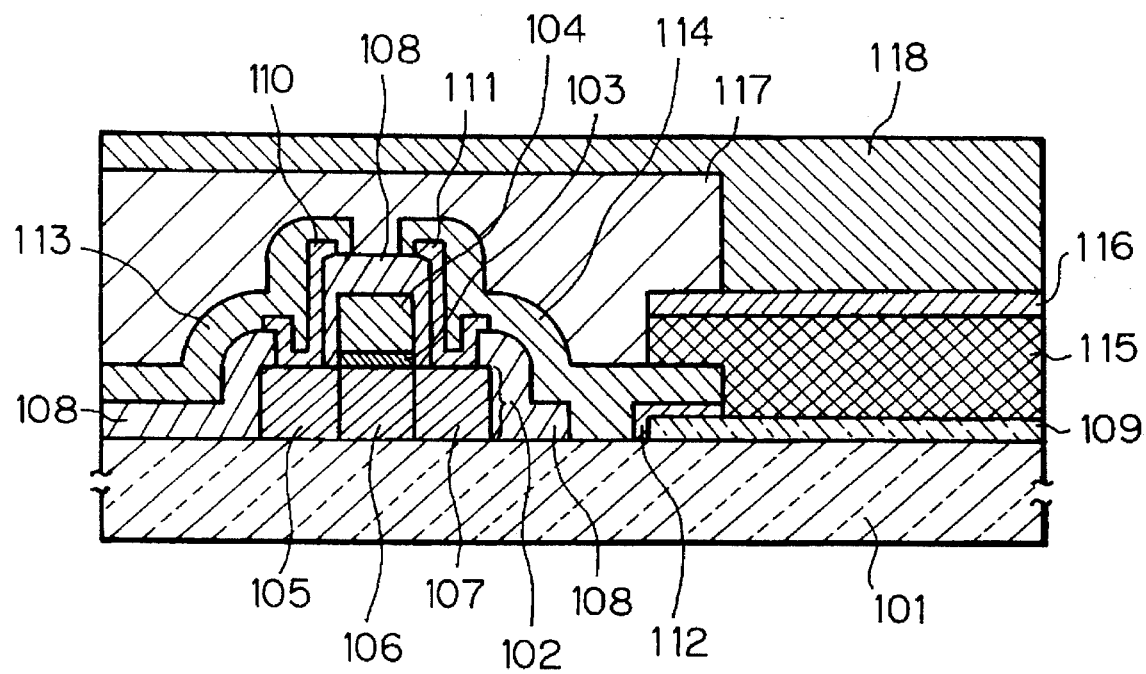
FIG. 1 shows a sectional view of a part of a preferred embodiment of an organic EL display device according to the present invention.

FIG. 1 shows an organic electroluminescence (EL) element and a current control thin film transistor for controlling current applied to the EL element in a preferred embodiment of an organic EL display device according to the present invention.

In FIG. 1, a reference numeral 101 denotes a transparent substrate such as a quartz substrate. On the substrate 101, many of the organic EL elements and their peripheral circuit elements such as current control thin film transistors, switching thin film transistors for switching the respective current control transistors, another thin film transistors which constitute peripheral driving circuits and capacitors are formed.

Each of the current control thin film transistors is substantially constituted by an active silicon layer 102 formed on the substrate 101, a gate oxide layer of $SiO_2$ 103 formed on a central region of the active silicon layer 102, a gate electrode of phosphorous doped polysilicon 104 laminated on the gate oxide layer 103, a source electrode and conductive lead of aluminum material 113 and a drain electrode and conductive lead of aluminum material 114. The gate electrode 104 can be made of aluminum material instead of the phosphorous doped polysilicon. In the active silicon layer 102, a source region 105, a channel region 106 and a drain region 107 are formed. To the source region 105 of the active silicon layer 102, the source electrode and conductive lead 113 is electrically coupled via a barrier metal layer of titanium nitride which contains 10 atm % of nitrogen 110. Also, to the drain region 107 of the active silicon layer 102, the drain electrode and conductive lead 114 is electrically coupled via a barrier metal layer of titanium nitride which contains 10 atm % of nitrogen 111. An insulation interlayer of $SiO_2$ 108 is formed between the active silicon layer 102 and the conductive leads 113 and 114 and between the gate electrode 104 and the barrier metal layers 110 and 111.

Each of the organic EL elements is substantially constituted by a transparent electrode layer of ITO (Indium Tin Oxide) 109 formed on the substrate 101, an organic EL layer 115 formed on the transparent electrode layer 109, an upper electrode layer of a magnesium film including silver material 116 formed on the EL layer 115 and a common electrode of aluminum material 118 formed on the upper electrode layer 116. The transparent electrode layer 109 is electrically coupled to the drain conductive lead 114 via a contact metal layer of titanium nitride which contains 10 atm % of nitrogen 112. A protection layer of $SiO_2$ 117 is formed between the common electrode 118 and the conductive leads 113 and 114.

Figure 2:
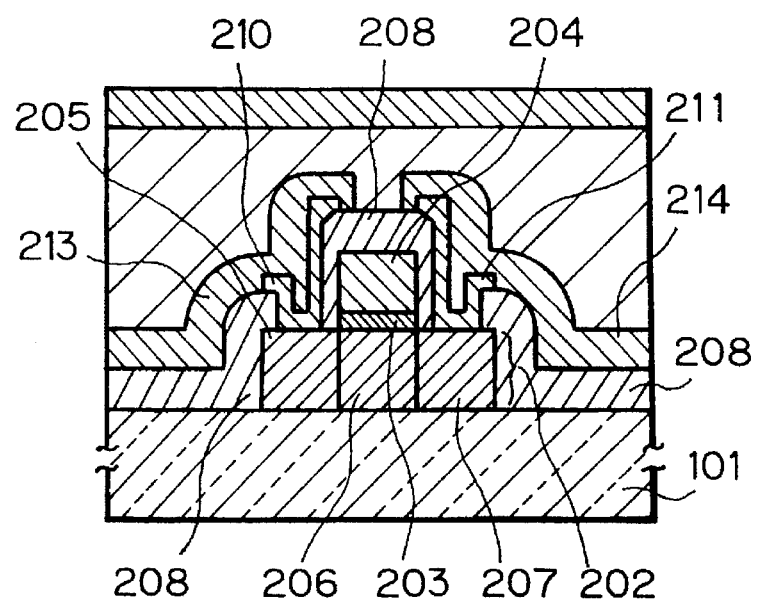
FIG. 2 shows a sectional view of a part of the embodiment shown in FIG. 1.

FIG. 2 shows the switching thin film transistor in the preferred embodiment of the organic EL display device according to the present invention.

Each of the switching thin film transistors is substantially constituted by an active silicon layer 202 formed on the substrate 101, a gate oxide layer of $SiO_2$ 203 formed on a central region of the active silicon layer 202, a gate electrode of phosphorous doped polysilicon 204 laminated on the gate oxide layer 203, a source electrode and conductive lead of aluminum material 213 and a drain electrode and conductive lead of aluminum material 214. The gate electrode 204 can be made of aluminum material instead of the phosphorous doped polysilicon. In the active silicon layer 202, a source region 205, a channel region 206 and a drain region 207 are formed. To the source region 205 of the active silicon layer 202, the source electrode and conductive lead 213 is electrically coupled via a barrier metal layer of titanium nitride which contains 10 atm % of nitrogen 210. Also, to the drain region 207 of the active silicon layer 202, the drain electrode and conductive lead 214 is electrically coupled via a barrier metal layer of titanium nitride which contains 10 atm % of nitrogen 211. An insulation interlayer of $SiO_2$ 208 is formed between the active silicon layer 202 and the conductive leads 213 and 214 and between the gate electrode 204 and the barrier metal layers 210 and 211.

Referring to FIGS. 3a to 3d, manufacturing processes of the current control thin film transistor and the organic EL element of this embodiment will be described in detail. It should be noted that manufacturing processes of the switching thin film transistor and another thin film transistors which constitute peripheral driving circuits of the EL element will be the same as following processes of the current control thin film transistor.

Figure 3A:
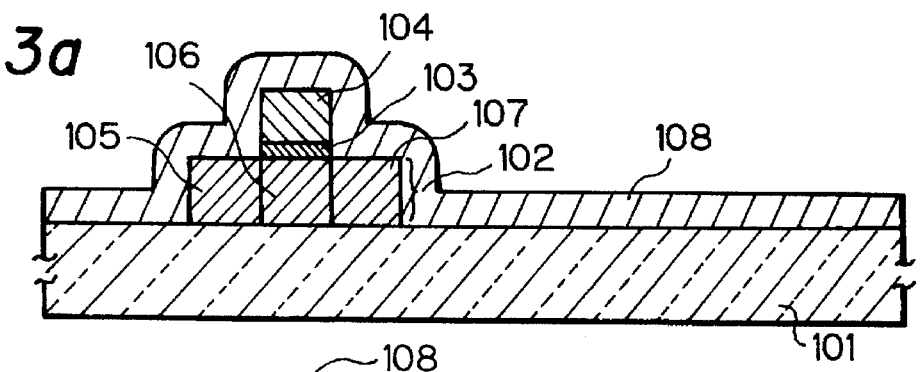
FIGS. 3a to 3d show sectional views of a part of manufacturing steps of the EL display device according to the embodiment shown in FIG. 1.
Figure 3B:
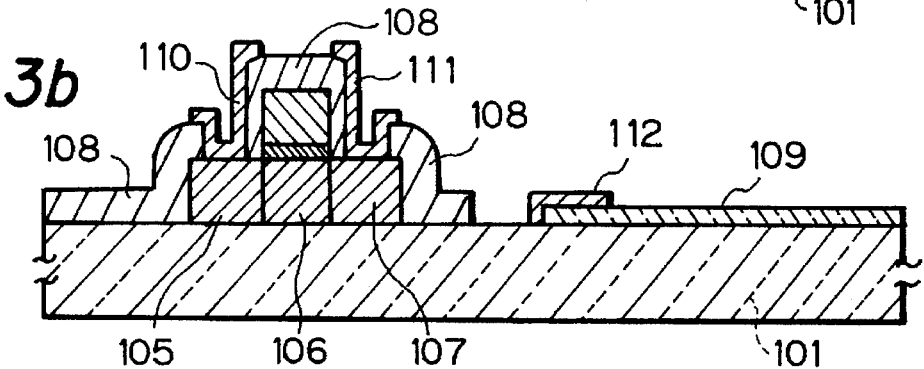

As shown in FIG. 3a, on a transparent substrate 101 such as a quartz substrate, a glass substrate or a ceramic substrate, an active silicon layer 102 with an island shape is formed by depositing an amorphous silicon layer by a CVD (Chemical Vapor Deposition) method, annealing the deposited amorphous silicon layer to form a polysilicon layer (solid-phase growth), and then performing patterning process of the polysilicon layer.

Then, on the active silicon layer 102, a gate oxide layer of $SiO_2$ 103 and a gate electrode of phosphorous doped polysilicon 104 are formed in lamination. The gate electrode 104 can be made of aluminum material instead of the phosphorous doped polysilicon. Thereafter, a source region 105, a channel region 106 and a drain region 107 are formed in the active silicon layer 102 by an ion doping method. In this embodiment, dopant is for example P and the gate electrode 104 is used as a mask for the doping process. Then, to cover all of these layers, an insulation interlayer of $SiO_2$ 108 is deposited.

Then, contact holes are formed by etching the insulation interlayer 108 at the source region 105 and at the drain region 107. Also, by this etching process, the insulation interlayer 108 in a region for forming the EL element is removed.

Then, an transparent conductive film of ITO, ZnO or SnO is sputtered to form an transparent electrode layer 109 in the EL element forming region on the substrate 101. Without removing the insulation interlayer 108 from the EL element forming region, the transparent electrode layer may be formed on this insulation interlayer 108 not directly on the substrate 101. Thereafter, a titanium nitride film consisting nitrogen of 10 atm % with a thickness of 100 to 1000 Angstrom preferably 500 Angstrom is deposited on all of these layers. Then, this deposited titanium nitride film is etched to simultaneously form a barrier metal layer of titanium nitride 110 on the source region 105, a barrier metal layer of titanium nitride 111 on the drain region 107 and a contact metal layer of titanium nitride 112 on the transparent electrode layer 109, respectively.

It will be apparent that barrier metal layers of titanium nitride in the switching thin film transistor and in the another thin film transistors which constitute peripheral driving circuits of the EL element can be simultaneously formed in this process.

Figure 3C:
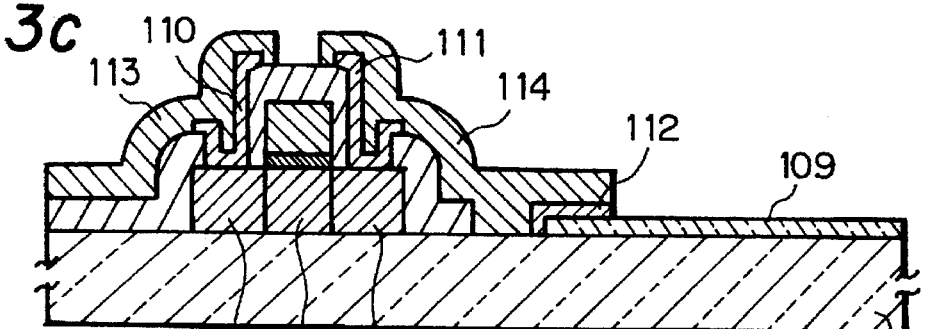

Then, as shown in FIG. 3c, an aluminum film with a thickness of 6000 Angstrom is deposited by for example sputtering to cover all of these layers and the deposited aluminum film is etched so as to form a source electrode and conductive lead 113 and a drain electrode and conductive lead 114. Thus, the source electrode and conductive lead of aluminum 113 is electrically coupled to the source region 105 of the active silicon layer 102 via the barrier metal layer of titanium nitride 110, and also, the drain electrode and conductive lead of aluminum 114 is electrically coupled to the drain region 107 of the active silicon layer 102 via the barrier metal layer of titanium nitride 111 and to the transparent electrode layer 109 via the contact metal layer of titanium nitride 112.

Figure 3D:
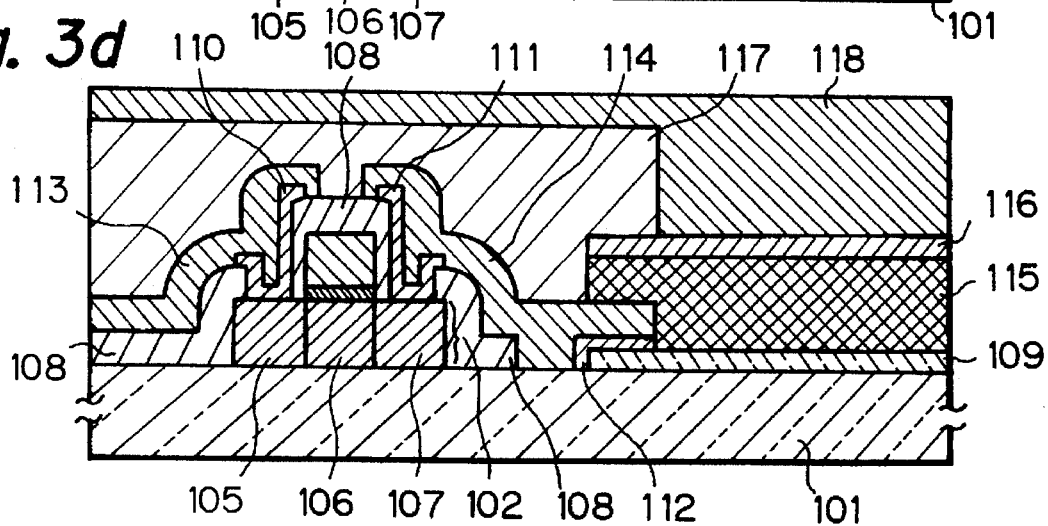

Then, as shown in FIG. 3d, an organic EL layer 115 and an upper electrode layer of a magnesium film including silver material 116 are formed in the EL element forming region on the transparent electrode layer 109 by vapor deposition methods using a metal mask. Thereafter, on these layers, a protection layer of $SiO_2$ 117 is deposited and a contact hole is etched on the upper electrode layer 116. Finally, a common electrode of aluminum material 118 is deposited on all of the matrix portion of the organic EL display device.

In the aforementioned embodiment, it is described that the barrier metal layers 110 and 111 and the contact metal layer 112 are made of titanium nitride containing 10 atm % of nitrogen. Higher containing amount of nitrogen in the titanium nitride material will increase degree of contact and stability but decrease electrical conductivity. Thus, according to the present invention, this containing amount of nitrogen in the titanium nitride material is selected to a value equal to or less than 50 atm %, preferably 5 to 15 atm % for obtaining both good stability and electrical conductivity.

According to the present invention, since the barrier metal layers in the current control thin film transistors arranged nearest to the respective organic EL elements are made of titanium nitride containing equal to or less than 50 atm % of nitrogen, no elusion of the barrier metal layers occurs resulting no short-circuit nor disconnection in the organic EL display device to keep high reliability of the organic EL display device. Furthermore, since both the barrier metal layers in the current control thin film transistors and the contact metal layer in the organic EL elements are simultaneously manufactured in the same process, manufacturing cost can be decreased. Of course, the contact metal layers of titanium nitride containing equal to or less than 50 atm % of nitrogen will result tight and stable contact between the respective conductive leads of aluminum and the respective transparent electrode layers.

According to the present invention, also, the barrier metal layers in the current control thin film transistors and the contact metal layers in the respective organic EL elements can be made of titanium. Thus, no elusion of the barrier metal layers occurs resulting no short-circuit nor disconnection in the organic EL display device to keep high reliability of the organic EL display device. Furthermore, if both the barrier metal layers in the current control thin film transistors and the contact metal layer in the organic EL elements can be simultaneously manufactured in the same process, manufacturing cost can be decreased. Of course, the contact metal layers of titanium will also result tight and stable contact between the respective conductive leads of aluminum and the respective transparent electrode layers.

Figure 4:
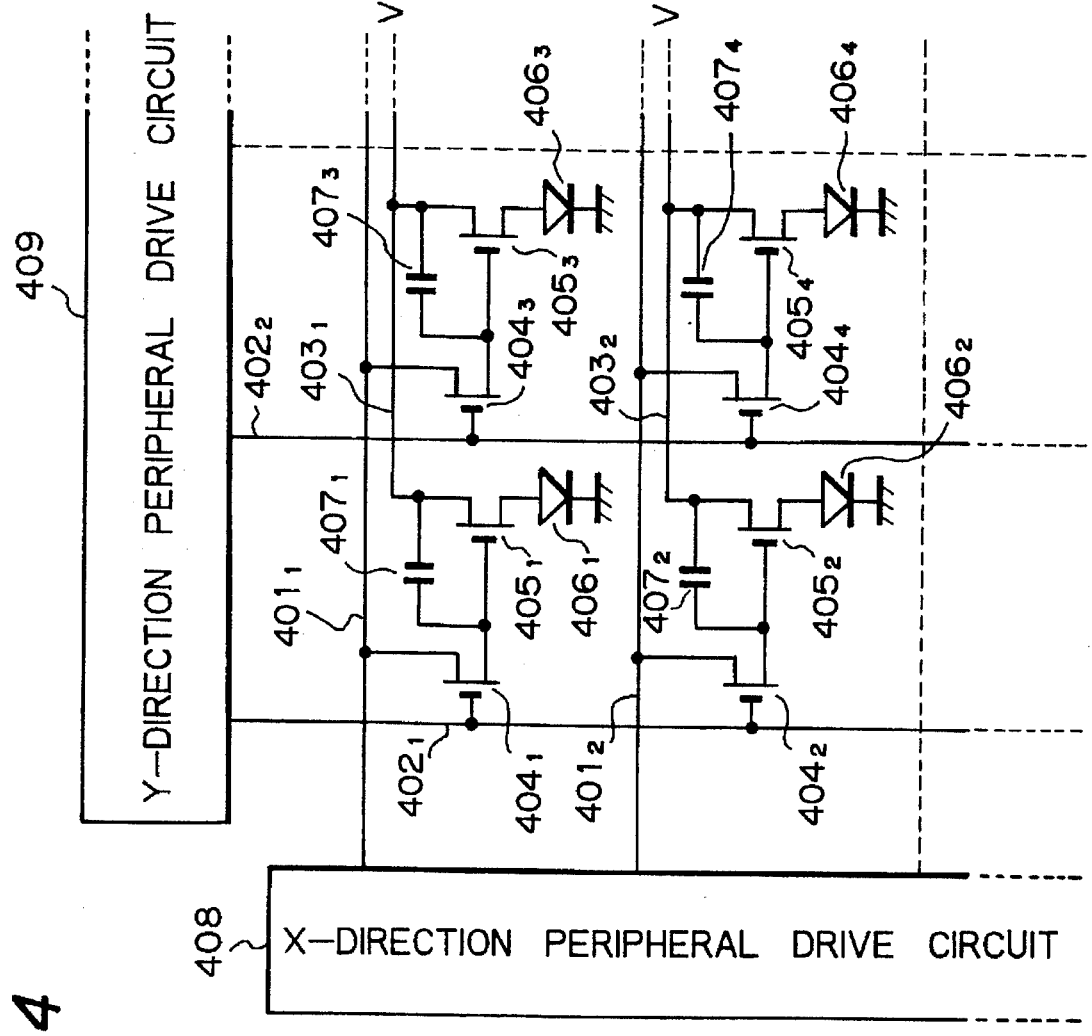
FIG. 4 shows a circuit diagram of the EL display device shown in FIG. 1.

As shown in FIG. 4, the organic EL display device according to the embodiment shown in FIG. 1 is constituted by X-direction signal lines $401_1$, $401_2$, ..., Y-direction signal lines $402_1$, $402_2$, ..., power supply lines (Vdd) $403_1$, $403_2$, ..., switching thin film transistors $404_1$, $404_2$, $404_3$, $404_4$, ..., current control thin film transistors $405_1$, $405_2$, $405_3$, $405_4$, ..., organic EL elements $406_1$, $406_2$, $406_3$, $406_4$, ..., capacitors $407_1$, $407_2$, $407_3$, $407_4$, ..., a X-direction peripheral drive circuit 408 and a Y-direction peripheral drive circuit 409.

Each of the pixels of the EL display device is specified by one of the X-direction signal lines $401_1$, $401_2$, ... and one of the Y-direction signal lines $402_1$, $402_2$, .... If a signal corresponding to picture data is applied to the X-direction signal line $401_2$ and Y-direction scanning signal is applied to the Y-direction signal line $402_1$, the switching transistor $404_2$ in the specified pixel turns on. Thus, the current control transistor $405_2$ controls current flowing from the power supply line $403_2$ into the organic EL element $406_2$ in accordance with the picture data causing corresponding light emission from this EL element $406_2$.

According to the present invention, at least the barrier metal layers in the current control thin film transistors and preferably the barrier metal layers in the switching thin film transistors are made of titanium nitride containing equal to or less than 50 atm % of nitrogen or made of titanium. In manufacturing the EL display device, it is desired that the contact metal layers in the organic EL elements are simultaneously formed in the same process of the barrier metal layers with the same material, namely titanium nitride containing equal to or less than 50 atm % of nitrogen or titanium. Furthermore, according to the present invention, the barrier metal layers in the thin film transistors in the peripheral drive circuits are preferably made of titanium nitride containing equal to or less than 50 atm % of nitrogen or made of titanium.

Many widely different embodiments of the present invention may be constructed without departing from the spirit and scope of the present invention. It should be understood that the present invention is not limited to the specific embodiments described in the specification, except as defined in the appended claims.

What is claimed is:

1. A thin film transistor formed in an organic electroluminescence display device having a substrate and a plurality of organic electroluminescence elements formed on said substrate, said transistor being used to drive one of said electroluminescence elements, said transistor comprising:

an active layer of semiconductor material, formed on said substrate, a source region and a drain region being formed in said active layer;

a source electrode of aluminum material electrically coupled to said source region formed in said active layer;

a drain electrode of aluminum material electrically coupled to said drain region formed in said active layer;

an insulation layer formed on said active layer;

a gate electrode formed on said insulation layer;

a first barrier metal layer of titanium nitride containing equal to or less than 50 atm % of nitrogen, inserted between said source electrode and said source region of said active layer; and a second barrier metal layer of titanium nitride containing equal to or less than 50 atm % of nitrogen, inserted between said drain electrode and said drain region of said active layer.

2. A thin film transistor formed in an organic electroluminescence display device having a substrate and a plurality of organic electroluminescence elements formed on said substrate, said transistor being used to drive one of said electroluminescence elements, said transistor comprising:

an active layer of semiconductor material, formed on said substrate, a source region and a drain region being formed in said active layer;

a source electrode of aluminum material electrically coupled to said source region formed in said active layer;

a drain electrode of aluminum material electrically coupled to said drain region formed in said active layer;

an insulation layer formed on said active layer;

a gate electrode formed on said insulation layer;

a first barrier metal layer of titanium inserted between said source electrode and said source region of said active layer; and a second barrier metal layer of titanium, inserted between said drain electrode and said drain region of said active layer.

3. An organic electroluminescence display device having a substrate, a plurality of organic electroluminescence elements formed on said substrate and a plurality of thin film transistors formed on said substrate, said transistors being connected to said respective electroluminescence elements for controlling current applied to said respective elements, each of said transistors comprising:

an active layer of semiconductor material, formed on said substrate, a source region and a drain region being formed in said active layer;

a source electrode of aluminum material electrically coupled to said source region formed in said active layer;

a drain electrode of aluminum material electrically coupled to said drain region formed in said active layer;

an insulation layer formed on said active layer;

a gate electrode formed on said insulation layer;

a first barrier metal layer of titanium nitride containing equal to or less than 50 atm % of nitrogen, inserted between said source electrode and said source region of said active layer; and a second barrier metal layer of titanium nitride containing equal to or less than 50 atm % of nitrogen, inserted between said drain electrode and said drain region of said active layer.

4. The device as claimed in claim 3, wherein each of said organic electroluminescence elements includes a transparent electrode layer formed on said substrate, an organic electroluminescence layer formed on said transparent electrode layer and an upper electrode layer formed on said organic electroluminescence layer, said transparent electrode being electrically coupled to a conductive lead of aluminum material, and wherein each of said organic electroluminescence elements further includes a contact metal layer of titanium nitride containing equal to or less than 50 atm % of nitrogen, inserted between said transparent electrode layer and said conductive lead.

5. The device as claimed in claim 4, wherein said conductive lead is connected to said drain electrode.

6. An organic electroluminescence display device having a substrate, a plurality of organic electroluminescence elements formed on said substrate and a plurality of thin film transistors formed on said substrate, said transistors being connected to said respective electroluminescence elements for controlling current applied to said respective elements, each of said transistors comprising:

an active layer of semiconductor material, formed on said substrate, a source region and a drain region being formed in said active layer;

a source electrode of aluminum material electrically coupled to said source region formed in said active layer;

a drain electrode of aluminum material electrically coupled to said drain region formed in said active layer;

an insulation layer formed on said active layer;

a gate electrode formed on said insulation layer;

a first barrier metal layer of titanium inserted between said source electrode and said source region of said active layer; and a second barrier metal layer of titanium inserted between said drain electrode and said drain region of said active layer.

7. The device as claimed in claim 6, wherein each of said organic electroluminescence elements includes a transparent electrode layer formed on said substrate, an organic electroluminescence layer formed on said transparent electrode layer and an upper electrode layer formed on said organic electroluminescence layer, said transparent electrode being electrically coupled to a conductive lead of aluminum material, and wherein each of said organic electroluminescence elements further includes a contact metal layer of titanium inserted between said transparent electrode layer and said conductive lead.

8. The device as claimed in claim 7, wherein said conductive lead is connected to said drain electrode.

9. An organic electroluminescence display device of active matrix type having a substrate, a plurality of organic electroluminescence elements formed on said substrate and a plurality of first and second thin film transistors formed on said substrate, said first transistors being connected to said respective electroluminescence elements for controlling current applied to said respective elements, said second transistors being connected to said respective first transistors for switching said respective first transistors, each of said first and second transistors comprising:

an active layer of semiconductor material, formed on said substrate, a source region and a drain region being formed in said active layer;

a source electrode of aluminum material electrically coupled to said source region formed in said active layer;

a drain electrode of aluminum material electrically coupled to said drain region formed in said active layer;

an insulation layer formed on said active layer;

a gate electrode formed on said insulation layer;

a first barrier metal layer of titanium nitride containing equal to or less than 50 atm % of nitrogen, inserted between said source electrode and said source region of said active layer; and a second barrier metal layer of titanium nitride containing equal to or less than 50 atm % of nitrogen, inserted between said drain electrode and said drain region of said active layer.

10. The device as claimed in claim 9, wherein each of said organic electroluminescence elements includes a transparent electrode layer formed on said substrate, an organic electroluminescence layer formed on said transparent electrode layer and an upper electrode layer formed on said organic electroluminescence layer, said transparent electrode being electrically coupled to a conductive lead of aluminum material, and wherein each of said organic electroluminescence elements further includes a contact metal layer of titanium nitride containing equal to or less than 50 atm % of nitrogen, inserted between said transparent electrode layer and said conductive lead.

11. The device as claimed in claim 10, wherein said conductive lead is connected to said drain electrode.

12. An organic electroluminescence display device of active matrix type having a substrate, a plurality of organic electroluminescence elements formed on said substrate and a plurality of first and second thin film transistors formed on said substrate, said first transistors being connected to said respective electroluminescence elements for controlling current applied to said respective elements, said second transistors being connected to said respective first transistors for switching said respective first transistors, each of said first and second transistors comprising:

an active layer of semiconductor material, formed on said substrate a source region and a drain region being formed in said active layer;

a source electrode of aluminum material electrically coupled to said source region formed in said active layer;

a drain electrode of aluminum material electrically coupled to said drain region formed in said active layer;

an insulation layer formed on said active layer;

a gate electrode formed on said insulation layer;

a first barrier metal layer of titanium inserted between said source electrode and said source region of said active layer; and a second barrier metal layer of titanium inserted between said drain electrode and said drain region of said active layer.

13. The device as claimed in claim 12, wherein each of said organic electroluminescence elements includes a transparent electrode layer formed on said substrate, an organic electroluminescence layer formed on said transparent electrode layer and an upper electrode layer formed on said organic electroluminescence layer, said transparent electrode being electrically coupled to a conductive lead of aluminum material, and wherein each of said organic electroluminescence elements further includes a contact metal layer of titanium inserted between said transparent electrode layer and said conductive lead.

14. The device as claimed in claim 13, wherein said conductive lead is connected to said drain electrode.

* * * * *